United States Patent [19]

Seibles et al.

[11] Patent Number: 4,960,677

[45] Date of Patent: Oct. 2, 1990

[54] DRY NONELECTROSCOPIC TONERS SURFACE COATED WITH ORGANOFUNCTIONAL SUBSTITUTED FLUOROCARBON COMPOUNDS

[75] Inventors: Josette C. Seibles, Piscataway; Howard Matrick, Highlands, both of N.J.

[73] Assignee: E. I. Du Pont de Nemours and Company, Wilmington, Del.

[21] Appl. No.: 86,018

[22] Filed: Aug. 14, 1987

[51] Int. Cl.$^5$ ................................................ G03C 5/04
[52] U.S. Cl. ..................................... 430/331; 430/407; 430/403; 430/110; 528/934; 428/407
[58] Field of Search ............... 430/331, 110; 428/403, 428/407; 528/934

[56] References Cited

U.S. PATENT DOCUMENTS

| | | | |
|---|---|---|---|
| 3,620,726 | 11/1971 | Chu et al. | 96/27 R |
| 3,649,268 | 3/1972 | Chu et al. | 96/27 R |
| 3,649,269 | 3/1972 | Kubota | 96/28 |
| 3,909,282 | 9/1975 | Gray | 106/288 Q |
| 4,019,821 | 4/1977 | Sandner | 401/4 |
| 4,068,017 | 1/1978 | Westdale | 427/18 |
| 4,069,791 | 1/1978 | Tobias | 118/120 |
| 4,139,483 | 2/1979 | Williams et al. | 252/62.1 P |
| 4,174,216 | 11/1979 | Bernard et al. | 430/257 |
| 4,191,572 | 3/1980 | Cohen et al. | 430/260 |
| 4,198,477 | 4/1980 | Williams et al. | 430/120 |
| 4,215,193 | 7/1980 | Manger et al. | 430/291 |
| 4,225,660 | 9/1980 | Russell, Jr. | 430/108 |
| 4,243,741 | 1/1981 | Abele et al. | 430/270 |
| 4,248,954 | 2/1981 | Datta et al. | 430/97 |
| 4,265,995 | 5/1981 | Mammino | 430/107 |
| 4,268,598 | 5/1981 | Leseman et al. | 430/107 |
| 4,268,599 | 5/1981 | Russell, Jr. | 430/108 |
| 4,294,904 | 10/1981 | Mammino | 430/122 |
| 4,369,240 | 1/1983 | Fickes | 430/17 |
| 4,388,396 | 6/1983 | Nishibayashi et al. | 430/126 |
| 4,397,941 | 8/1983 | Fickes | 430/331 |
| 4,430,408 | 2/1984 | Sitaramiah | 430/106.6 |
| 4,546,072 | 10/1985 | Matrick | 430/449 |
| 4,565,773 | 1/1986 | Matrick | 430/331 |
| 4,579,810 | 4/1986 | Johnson et al. | 430/293 |

FOREIGN PATENT DOCUMENTS

| | | |
|---|---|---|
| 2138932 | 11/1977 | Japan. |
| 2138933 | 11/1977 | Japan. |
| 5117154 | 9/1980 | Japan. |
| 7016460 | 1/1982 | Japan. |
| 9223459 | 7/1984 | Japan. |
| 9223459 | 12/1984 | Japan. |
| 0159857 | 8/1985 | Japan. |

*Primary Examiner*—J. David Welsh

[57] ABSTRACT

A dry nonelectroscopic toner surface coated with 3 to 40% by weight of an organofunctional substituted fluorocarbon compound. Toners of the invention are useful for developing photosensitive elements having imagewise tacky and complementary nontacky image areas. The surface coating imparts good toning and clean-up characteristics, together with improved performance on aging.

33 Claims, No Drawings

DRY NONELECTROSCOPIC TONERS SURFACE COATED WITH ORGANOFUNCTIONAL SUBSTITUTED FLUOROCARBON COMPOUNDS

TECHNICAL FIELD

This invention relates to dry nonelectroscopic toners and processes of their use. More particularly, this invention relates to dry nonelectroscopic toners comprising pigmented organic resin particles treated with an organofunctional substituted fluorocarbon compound, and their use in toning photosensitive elements having imagewise tacky and complementary nontacky image areas.

BACKGROUND ART

Reproduction processes are known wherein positive-working photopolymerizable elements and negative-working photosensitive elements are exposed to actinic radiation through a transparency to produce a pattern of tacky and complementary nontacky image areas. A positive-working photopolymerizable element is described, for example, in Chu and Cohen, U.S. Pat. No. 3,649,268 and a negative-working photosensitive element is described in Cohen and Fan, U.S. Pat. Nos. 4,174,216 and 4,191,572. The image may be developed by toning with a suitable particulate material which desirably adheres only in the tacky image areas. Excess toner which may be present is removed from the nonimage areas leaving, for example, an image which is a proof of the original or which can be transferred to another surface. Multilayer multicolor proofs such as surprint or overlay pre-press proofs are a particularly advantageous use of such toned elements. The process for preparation of such proofs is well known in the graphic arts, and is described in detail, for example, in U.S. Pat. Nos. 3,649,268 and 4,174,216, the teaching of which is hereby incorporated by reference.

In view of the importance of pre-press proofing to the printing industry and the problems inherent therein, improved toners are of significant commercial importance. For acceptable toning of photosensitive elements having imagewise tacky and nontacky areas, it is important that the toner adhere evenly and reproducibly to the tacky image areas while being easily and substantially completely removable from the corresponding nonimage areas. Some recognized improvements in nonelectroscopic toners are those described in Chu and Manger, U.S. Pat. No. 3,620,726, mixtures using these toners described in Gray, U.S. Pat. No. 3,909,282, and the toners of Manger, Fickes and Long described in U.S. Pat. No. 4,215,193. Improved toner applicators are the subject of Sandner, U.S. Pat. No. 4,019,821 (hand operated toning) and Tobias, U.S. Pat. No. 4,069,791 (automatic toning).

Application of toners to tacky image areas of photosensitive elements has the problem that the toners tend to produce background color in the nontacky areas as well. This color is frequently very difficult to remove completely. Generally an attempt is made to remove the excess toner from the nontacky areas, e.g., by air impingement or by wiping with a cloth, brush, or other removal means. While wiping is a simple operation, it is aesthetically unpleasant, requires operator involvement, takes time and uses a consumable (e.g., a Las-Stik®) cloth.

Wiping may also exacerbate the difficulties of toner removal by generating static electricity. It is known that static is generated by rubbing dissimilar materials together. The amount of static generated varies, depending on the nature of the particular photosensitive layer being toned and the toner removal means. For example, cleaning brushes close to the photosensitive layer in the triboelectric table would be expected to generate a relatively small charge. Thus it would be expected that an acrylic brush would generate only a small charge with respect to an element that contains an acrylic compound as a major component of the photosensitive layer. The toner, however, can also generate a charge against the brush or other cleaning means and the photosensitive element. If the toner, cleaning means, and element were to have an identical place in the triboelectric table, substantially no static charge would be generated. Such a system, while desirable in this respect, is generally not realizable. Despite the problems, it is nevertheless usually desirable to reduce background color as much as possible by removing excess toner. Even after manual or machine cleaning operations, however, some undesirable background color is usually present in the nontacky areas.

The term "background color", as used herein, is the color present in the nontacky background areas of an exposed and toned positive-working or negative-working photosensitive element prior to any step being taken to remove toner therefrom. Background color is the sum of two components. "Stain" is used herein to mean the color which is normally not capable of being removed from the background areas despite thorough wiping. "Clean-up" is the color normally capable of being removed from the background areas, e.g., by wiping, air impingement, etc.

It has been found that a given quantity of toner is used more efficiently and lasts longer when applied by machine than by hand. Automatic toning machines have also improved the uniformity and consistency of short-term proof-to-proof toning density, so that changes in toner performance can be more readily assessed. These factors increase the need for toners which perform uniformly and reproducibly over time. The need for consistent toning despite toner aging is exacerbated by the international nature of the graphic arts business and the length of time sometimes needed to get toners from the manufacture to the ultimate user.

U.S. Pat. No. 4,397,941 to Fickes teaches dry nonelectroscopic toners comprising pigmented organic resin particles having a size distribution of 0.2 to 30 micrometers, which are surface treated with at least 0.5% by weight of a slip agent selected from: a silicone oil having a weight average molecular weight of about 230 to 50,000; a saturated hydrocarbon having a weight average molecular weight of about 200 to 10,000; or a fluorocarbon compound having a weight average molecular weight of about 500 to 500,000, in combination with at least 1% by weight of a defined antistatic agent. Suitable antistatic agents include anionic, cationic, amphoteric and nonionic compounds. Such toners exhibit good clean-up and are substantially nonstaining in the nontacky areas of the photosensitive elements used to prepare multilayer pre-press proofs. On the other hand, the optical density of toning with some such toners, e.g., magenta and cyan, tends to be below the density required for pre-press proofs. In addition, the consistency of toning density from proof to proof deteriorates as the toner ages.

U.S. Pat. No. 4,546,072 to Matrick describes dry, nonelectroscopic toner particles which are surface coated with a liquid slip agent, such as silicone oil or a fluorocarbon compound, and a solution containing a cationic polymeric quaternary ammonium antistatic agent. These toners exhibit clean-up qualities and nonstaining of the nontacky areas of photosensitive elements of quality comparable to dry nonelectroscopic toners surface coated as taught in U.S. Pat. No. 4,397,941, as well as high optical density, particularly on magenta and cyan toners, together with excellent aging stability with respect to density and background color. However, with some mixing equipment, the toners are coated with the two liquids sequentially, which complicates manufacture, testing and analysis of the toners.

U.S. Pat. No. 4,565,773 to Matrick describes dry nonelectroscopic toner particles surface coated with a single liquid, a nonionic siloxane-oxyalkylene block copolymer. When fresh, these toners have satisfactory cleanup qualities and are nonstaining of the nontacky areas of the photosensitive element of quality comparable to that provided by known dry electroscopic toner particles, such as those surface coated as taught in U.S. Pat. Nos. 4,397,941 and 4,546,072. However, upon aging these toners surface coated with a nonionic siloxane-oxyalkylene block copolymer have poor clean-up properties.

It is desired to provide dry nonelectroscopic toners which can be surface coated with a single compound to provide improved aging stability, in addition to cleanup qualities and nonstaining of nontacky areas of the photosensitive element comparable to known dry nonelectroscopic toners, such as those described above. Preferably, the coating compound is a neat liquid at the application temperature.

BRIEF SUMMARY OF THE INVENTION

In accordance with this invention, there is provided a dry, nonelectroscopic toner comprising pigmented organic resin particles having a size distribution within the range of 0.2 to 30 micrometers and not more than 50% of the particles being less than 1 micrometer in particle size, the improvement wherein the pigmented particles are surface coated with 3–40% by weight of an organofunctional substituted fluorocarbon compound having a volatility such that, under normal atmospheric conditions, the boiling point is greater than 300° F., and (1) having a general formula R(f)QA
wherein
R(f) is a perfluoroalkyl group,
$C_nF_{(2n+1)}$, where n is from 4 to 20;
Q is a divalent bridging group capable of connecting the R(f) group with the A group,
Q being an alkylene/oxy group, $(-CH_2-)_xO-$, or an alkylene group, $(-CH_2-)_x$, where x is from 2 to 6; a sulfonamido group, $-SO_2N(R_1)-$; or a sulfonamido/alkylene group, $-SO_2N(R_1)(CH_2)_x-$, where $R_1$ is $C_1$ to $C_6$ alkyl and x is from 2 to 6; and
A is the terminal group, A being H when Q is sulfonamido; $-(R_2O)_mR_3$ where $R_2$ is an alkylene group of 2 to 6 carbons or mixtures thereof, and $R_3$ is H or $C_1$ to $C_4$ alkyl, and m is 1 to 22; or
A is an acrylate group, $-OOCC(R_4)=CH_2$, where $R_4$ is H, $-CH_3$, or $-C_2H_5$; or
(2) being a fluoroaliphatic polymeric ester.

DETAILED DESCRIPTION OF THE INVENTION

This invention provides dry, nonelectroscopic toners surface coated with organofunctional substituted fluorocarbon compounds. These toners exhibit clean-up properties comparable to known dry nonelectroscopic toners, together with superior stability on aging. It also permits nonelectroscopic toners to be surface coated with a single compound, and eliminates the need to use both an antistatic agent and a "slip" or antistain agent (except for full strength yellow toners). Most of the fluorinated compounds of the invention exist as liquids over the range of usual application temperatures. These compounds are preferred since surface coating nonelectroscopic toners with a single component neat liquid simplifies manufacture, testing and analysis of the toners. Manufacturing advantages include elimination of solvent handling, recovery, and disposition, as well as the equipment, operating, and energy costs of such operations. Toners of the invention also provide excellent toning on both positive- and negative-working photosensitive elements which, upon exposure, form tacky and nontacky image areas. This allows a single set of toners to be used for both positive- and negative-working proofing systems. Such versatility is of significant commercial value.

Manufacture of the dry nonelectroscopic toners of the invention involves mechanical blending of pigmented resin particles with the neat fluorinated nonionic liquid. The improved dry toners of this invention are nonelectroscopic toners comprising pigmented organic resin particles having a size distribution within the range of 0.2 to 30 micrometers, not more than 50 percent of the particles being less than 1 micrometer in particle size. The term "particle size" as used herein with respect to the toners refers to the size distribution of the smallest independently acting unit which is capable of differentiating between the tacky and nontacky areas of the photoimaged element.

Nonelectroscopic means that the toners are neither repelled nor attracted to a charged rod placed in close proximity to the particles. The lower propensity of the toners of the invention to stain nontacky areas and the ease with which the toners can be removed from such areas as well as the high density and stability on aging are largely attributable to the surface coatings of the invention.

The pigmented organic resin particles are described in Chu and Manger, U.S. Pat. No. 3,620,726, the teaching of which is hereby incorporated by reference. These particles are surface coated with the fluorinated nonionic compounds of the invention. This is generally accomplished in a Patterson-Kelly Twin Shell Blender manufactured by Patterson-Kelly Co., Division of Harsco Corp., East Stroudsburg, Pa. or a Red Devil #30, 5400 Paint Conditioner Model MKI-R, Red Devil, Inc., Union, N.J. Other comparable blending devices, e.g., a Ross planetary mixer (manufactured by Charles Ross and Co., Hauppauge, N.Y.), can be used.

In accordance with this invention, there is provided a dry nonelectroscopic toner comprising pigmented organic resin particles having a size distribution within the range of 0.2 to 30 micrometers and not more than 50% of the particles being less than 1 micrometer in particle size, the improvement whereby the pigmented particles are surface coated with 3–40%, preferably 5–30% by weight of an organofunctional substituted fluorocarbon compound having a volatility such that under normal atmospheric conditions the boiling point is greater than 300° F., and (1) having a general formula R(f)QA,
wherein
R(f) is a perfluoroalkyl group, $C_nF_{(2n+1)}$, where n is from 4 to 20;
Q is a divalent bridging group capable of connecting the R(f) group with the A group,
Q being an alkylene/oxy group, $(-CH_2-)_xO-$, or an alkylene group, $(-CH_2)_x$, where x is from 2 to 6; a sulfonamido group, $-SO_2N(R_1)-$; or a sulfonamido/alkylene group, $-SO_2N(R_1)(CH_2)_x-$, where $R_1$ is $C_1$ to $C_6$ alkyl and x is from 2 to 6; and
A is the terminal group, A being H when Q is sulfonamido, $-(R_2O)_mR_3$ where $R_2$ is an alkylene group of 2 to 6 carbons or mixtures thereof, and
$R_3$ is H or $C_1$ to $C_4$ alkyl, and m is 1 to 22, or
A is an acrylate group, $-OOCC(R_4)=CH_2$ where $R_4$ is H, $-CH_3$, or $-C_2H_5$; or (2) being a fluoroaliphatic polymeric ester.

Most of the organofunctional substituted fluorocarbon compounds of the invention exist as liquids in the temperature range at which they are applied to the toner particles. Preferred compounds of the invention exist as liquids having a viscosity of less than 5,000 cs. in such a temperature range.

More specifically, suitable organofunctional substituted fluorocarbon compounds, and more preferably, neat organofunctional substituted fluorocarbon liquids, are selected from one of the following groups, consisting of:

a. $C_nF_{(2n+1)}SO_2N(R_1)(R_2O)_mR_3$,
where
n is 4 to 20,
m is 0 to 22,
$R_2$ is alkylene of 2 to 6 carbons or mixtures thereof,
$R_1$ and $R_3$ are independently H or $C_1$ to $C_6$ alkyl, provided that when m is O, $R_3$ is H.

b. $C_nF_{(2n+1)}SO_2NR_1R_5$,
where
n is 4 to 20,
$R_1$ is $C_1$ to $C_6$ alkyl,
$R_5$ is an acrylate, $-OOCC(R_4)=CH_2$, where $R_4$ is H, $CH_3$, or $C_2H_5$.

c. $C_nF_{(2n+1)}SO_2N(R_1)(R_2O)_m-R_3$,
where
n is 6 to 8, preferably 6.5 to 7.5,
$R_1$ is $C_2H_5$,
$R_2$ is $-CH_2CH_2-$
m is O or 6 to 8, preferably, m is 7,
$R_3$ is H or $CH_3$, and provided that m is O when $R_3$ is H.

d. $C_nF_{(2n+1)}SO_2N(R_1)(R_5)$,
where
n is 6 to 8, preferably 6.5 to 7.5,
$R_1$ is $C_1$ to $C_6$ alkyl,
$R_5$ is an acrylate, $-OOCC(R_4)=CH_2$, where $R_4$ is H, $CH_3$, or $C_2H_5$.

e. $C_nF_{(2n+1)}-R_2O-(R_2O)_m-R_3$,
where
n is 4 to 20,
m is 5 to 13,
$R_2$ is an alkylene of 2 to 6 carbons, or mixtures thereof,
$R_3$ is H or $C_1$ to $C_4$ alkyl.

f. $C_nF_{(2n+1)}-CH_2CH_2O-(CH_2CH_2O)_m-R_3$,
where
n is 4 to 20,
m is 5 to 13,
$R_3$ is H or $C_1$ to $C_4$ alkyl.

g. $C_nF_{(2n+1)}-CH_2CH_2O-(CH_2CH_2O)_m-R_3$,
where
n is 6 to 8, preferably 7.3,
m is 6 to 8, preferably 7.3,
$R_3$ is H or $C_1$ to $C_4$ alkyl.

h. $C_nF_{(2n+1)}(CH_2)_xR_5$,
where
n is 4 to 20,
x is 2 to 6,
$R_5$ is $-OOCC(R_4)=CH_2$, where $R_4$ is H, $CH_3$, or $C_2H_5$.

i. $C_nF_{(2n+1)}(CH_2)_xR_5$,
where
n is 6 to 8, preferably 7.3,
x is 2 to 6, $R_5$ is $-OOCC(R_4)=CH_2$ where $R_4$ is H, $CH_3$, or $C_2H_5$.

j. Fluoroaliphatic polymeric esters.

The preferred organofunctional substituted fluorocarbon liquids of the invention should have the following properties:

1. Be a neat liquid at the temperature at which it is applied to the toner particles, preferably at temperatures of 20°–30° C. The compound should melt at below 100° C., preferably below 50° C.

2. Have sufficiently low viscosity so that the fluorinated liquid can be easily delivered and applied to the toner particles, and be capable of becoming uniformly distributed on the surface of the toner particles. The viscosity of the liquid should be less than 5000 cs., preferably less than 1000 cs., and more preferably less than 300 cs. The compounds of the invention are nonionic, a property which is important because it permits the compounds to exist in the form of low viscosity liquids in the preferred temperature range.

3. Have sufficiently low volatility so the treatment remains on the toner particles over the life of the toner. This means that generally the liquid should have a boiling point of greater than 300° F. (149° C.).

Various types of known organofunctional substituted fluorocarbon compounds may be used for treating and coating the particulate toner surface. Useful compounds include:

| LIQUID ADDITIVE # | FLUORINATED COMPOUND | BP (°C.) | MP (°C.) | VISCOSITY (cs) | SP. GR. | REF. INDEX |
| --- | --- | --- | --- | --- | --- | --- |
| 1 | FLUORAD ® FC171 | >149 | −6 | 130 | 1.4 | 1.398 |
| 2 | FLUORAD ® FX189 | >149 | −10 to −25 | 100 | 1.5 | 1.381 |
| 3 | FLUORAD ® FC430 | >149 | −25 | 3043 | 1.15 | 1.445 |
| 4 | FLUORAD ® FX12 | 110* | 80 to 90 | SOLID AT RT | 1.6 | — |
| 5 | ZONYL ® FSO 100 | 200 | 50 | 18.4 | 1.36 | — |

-continued

| LIQUID ADDITIVE # | FLUORINATED COMPOUND | BP (°C.) | MP (°C.) | VISCOSITY (cs) | SP. GR. | REF. INDEX |
|---|---|---|---|---|---|---|
| | | | | at 55° C. | | |
| 6 | MEGAFAC ® FC-141 | | | 121 | 1.4 | |
| 7 | FLUOWET ® OT | 160 | 30 | SEMI-SOLID AT RT | 1.6 | |
| 8 | MPD6931 | 100 TO 200 | TO 40 | | | |
| 9 | LODYNE ® S-107B | 90 TO 96 | — | — | 1.06 | |
| 10 | SURFLON ® -145 | — | — | — | 1.03 | |

*at 2 mm Hg.
"Fluorad" is the registered trademark of 3M, Minneapolis, MN.
"Zonyl" is the registered trademark of E. I. du Pont de Nemours and Company, Wilmington, DE.
"Megafac" is the registered trademark of Asahi Glass, Tokyo, Japan.
"Fluowet" is the registered trademark of American Hoechst, Somerville, NJ.
MPD6931 is manufactured by E. I. du Pont de Nemours and Company, Wilmington, DE.
"Lodyne" is the registered trademark of Ciba-Geigy, Ardsley, NY.
"Surflon" is the registered trademark of DiaNippon Ink, Tokyo, Japan.
NOTE:
LODYNE ® and SURFLON ® are not neat liquids, but are purchased dissolved in an appropriate solvent. After application of the commercial liquid, the solvent dries leaving the fluorinated compound on the surface of the toner particles. The data provided above represent the compounds in isopropanol/water and isopropanol/water/dioxane solvents, respectively.

The liquid additives used for the control samples are as follows:

Liquid Additive 11 is polydimethyl siloxane, silicone oil slip agent, 200 Fluid 100 CS, Dow Corning Co., Midland, Mich.

Liquid Additive 12 is an antistatic compound of the formula: $R(OCH_2CH_2)_n-OH$, wherein R is an alkyl chain derived from tridecyl alcohol.

Liquid Additive 13 is Poly(dimethyl diallyl ammonium chloride) homopolymer, Merquat ® 100, Merck Co., Rahway, N.J.

Liquid Additive 14 is a siloxane-oxyalkylene block copolymer, Silwet ® L-7500, which has a Viscosity of 175 cs at 25° C., Melting Point −43° C., Specific Gravity at 25° C. of 0.99, and a Flash Point of 150° F. using Pensky-Martens closed cup, ASTM Method 093, manufactured by Union Carbide, Danbury, Conn.

The amount of organofunctional substituted fluorocarbon compound of the invention present on the surface of the pigmented organic resin particles is in the range of about 2 to 40% by weight, preferably in the range of about 4 to 35% by weight and, more preferably, 20 to 30% by weight, with the percentage by weight based on the total weight of treated toner particles. One or more fluorinated liquids can be mixed together prior to application as long as they form a single phase liquid, or more than one compound may be dissolved in an organic solvent or mixture of solvents.

As described in Example 1 below, the surface treated pigmented organic resin particles of the invention provide particularly good results when applied to tacky image areas using a modified automatic toning apparatus such as that described in Tobias, U.S. Pat. No. 4,069,791, the teaching of which is hereby incorporated by reference.

The static charge on the surface-treated toners of the invention can be determined by a test procedure as follows:

50 grams of prepared magenta toner (type described in Example 2) and twelve ¼ inch (0.635 cm) stainless steel balls are placed in 8 oz. polypropylene jars and allowed to stand for two weeks in a room with a relative humidity of 20%. The toners are thoroughly mixed by hand shaking for 60 seconds. After shaking the lids are removed and the toners immediately placed on plain white paper located on a grounded stainless steel surface. The voltage is recorded after 3 minutes by means of a Sweeney Static Meter No. 1127 (contains radioactive material) dated 2/74, B. K. Sweeney Manufacturing Co., Denver, Colo. The results achieved with the treated (coated) and untreated toners are set forth in Table 1, wherein the percentages are by weight:

TABLE 1

| Sample | Additive* | Amount (%) | Voltage |
|---|---|---|---|
| 1 | none | — | +1000 v |
| 2[a] | 12/11 | 10.0/4.2 | 0 |
| 3[b] | 14 | 20.0 | 0 |
| 4 | ·1 | 25.0 | 0 |
| 5[c] | 13/11 | 7.0/9.0 | 0 |

*Numbers of Additives correspond to those set forth earlier.
[a]toner described in Fickes, U.S. Pat. No. 4,397,941
[b]toner described in Matrick, U.S. Pat. No. 4,565,773
[c]toner described in Matrick. U.S. Pat. No. 4,546,072

The nonelectroscopic toners of this invention are useful for color development of a surface having imagewise tacky and nontacky areas. The toner particles are distributed over the imagewise exposed surface whereby the toner particles adhere to or become embedded solely in the tacky image areas. The remaining toner particles are physically removed, e.g., by wiping with a suitable cloth or clean-up section of a toning apparatus if one is used. The nontacky areas are left substantially free of the toner particles. Examples of photosensitive elements which can be imagewise exposed to produce such imagewise tacky and complementary nontacky areas include the following:

(a) a photopolymerizable layer (positive-working wherein the exposed areas become photohardened) (Chu and Cohen, U.S. Pat. No. 3,649,268);

(b) a photosensitive layer comprising at least one thermoplastic binder and a photosensitive system, consisting essentially of:

I. at least one dihydropyridine compound of the formula

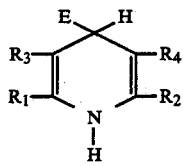

wherein

R is alkyl, alkenyl of 3 to 11 carbon atoms, phenylalkyl, phenylalkenyl, unsubstituted aryl of 6 to 10 carbon atoms, and heteroaryl;

$R_1$ and $R_2$, which can be the same or different, are alkyl; and $R_3$ and $R_4$, which can be the same or different, are COOR', COR', CN, R' is alkyl; and, II. at least one hexaarylbiimidazole compound (negative-working wherein the exposed areas are tacky) (Abele and Grossa, U.S. Pat. No. 4,243,741);

(c) an imagewise exposed element containing nontonable image areas and tacky nonphotosensitive image areas (also a negative-working element) (Cohen and Fan, U.S. Pat. No. 4,174,216). The teaching of these patents is hereby incorporated by reference.

Other systems known to those skilled in the art can be used provided that imagewise exposure produces tacky and complementary nontacky image areas. The tacky and nontacky image areas in these systems can be formed either directly, e.g., by exposure to actinic radiation, or by treatment with solutions, heat or other means to obtain tacky image areas.

Such elements developed with a nonelectroscopic toner surface coated according to the invention can be used to form surprint multicolor proofs by laminating at least one other tonable photoimageable layer in register over the previously imagewise toned layer. Each tonable layer is exposed through a different color separation record and colored or developed with toners in a spectral region corresponding to the color separation record used for exposure. In most cases, four photoimaged elements toned yellow, magenta, cyan, and black are superimposed in a surprint proof.

Some toners, for example a yellow toner as described in Example 4 below, may require the addition of small amounts of silicone oil to further improve antistain characteristics.

A preferred mode for carrying out the invention is illustrated in Example 1, Liquid Additive 1, Table 2.

INDUSTRIAL APPLICABILITY

The dry nonelectroscopic toners of the invention are useful for color development of the tacky image areas of positive- or negative-working photosensitive surfaces which are used to prepare pre-press color proofs, e.g., overlays and surprints, for the printing industry. The toners are particularly adapted to use in conjunction with toning apparatus, e.g., an automatic toning apparatus as described in Tobias, U.S. Pat. No. 4,069,791, without the need for a clean-up section. The toners are easily prepared, requiring only one surface coating, which permits shorter blending time when compared with two surface coatings. The toners exhibit good toning and are substantially nonstaining in the nontacky areas of both positive- and negative-working photosensitive elements. Clean-up of excess toner is more easily accomplished with toners surface coated according to the invention. Moreover, the toners of the invention retain good and uniform toning characteristics on aging.

EXAMPLES

The invention is illustrated by the following examples, wherein the percentages are by weight.

L*A*B* values set forth in the examples below are calculated using the equations found on page 63 under the discussion of 1976 CIE L*A*B* (CIELAB system) in F. W. Billmeyer and M. Saltzman, "Principles of Color Technology," 2nd Edition 1981, pages 62 and 63. After subtracting the L*A*B* values for the area under the protective label from the L*A*B* values for the unprotected nontacky or background areas of the toned photosensitive elements, ΔE is calculated using the following equation:

$$\Delta E = \sqrt{(\Delta L^*)^2 + (\Delta A^*)^2 + (\Delta B^*)^2}$$

EXAMPLE 1

The following ingredients were used to prepare magenta toner:

| INGREDIENTS | AMOUNT (G) |
| --- | --- |
| Quindo ® Magenta, Pigment Red 122, C.I. 73915, Mobay Chemical, Harmon Colors, Haledon, NJ | 4600 |
| Indo ® Brilliant Scarlet, Pigment Red 123, C.I. 71145, Mobay Chemical, Harmon Colors, Haledon, NJ | 875 |
| Cellulose Acetate | 7000 |
| Acetone | 27222 |
| Water | 21778 |

The water and acetone were thoroughly mixed and were charged to a Type 30-S attritor, stirred and jacketed ball mill (Union Process Co., Akron, Ohio). This mill contained ⅛ in. (0.49 cm) Type 440 stainless steel balls that were agitated at 150 rpm. A nitrogen atmosphere was maintained in the mill during the mixing procedure. Approximately two-thirds of the weight of the cellulose acetate was then added during a 3 to 5 minute period and was agitated in the liquid for about 2 minutes. The pigment was then added over a 2-minute period followed by the remainder of the cellulose acetate. The mixture was then agitated at about 150 rpm in the mill for 6 hrs. at 22° C.; 5 gallons of water were added in 2 minutes followed by agitation for 5 minutes. The mill was drained and washed with water and the combined effluents were filtered to collect the wet toner. The wet toner was water-washed and dried in an oven at 115° to 125° C., and the dried toner was pulverized in a pin mill. The particle size distribution of the toner at this point was 0.2 to 30 micrometers with not more than 50% of the particles less than 1 micron equivalent spherical diameter.

400 grams of the untreated magenta toner, an appropriate amount of a surface treatment liquid as indicated in Table I, and two 9-inch (22.86 cm) stainless steel chains were added to a two quart Bain Marie container (Le Beau Products, Baraboo, Wis. 53913). The contents were stirred by hand with a spatula so that no "wet" spots were left on the bottom or sides of the container. The mixture was then blended 30 minutes on a Red Devil Paint Conditioner, Model MIK-R (Red Devil, Inc., Union, N.J.). The surface-treated magenta toner was then applied to a positive-working photosensitive element by means of an automatic toning apparatus as described in Tobias, U.S. Pat. No. 4,069,791. The positive working element used was similar to that described in Example 1 of Assignee's U.S. Pat. No. 3,649,268. To obtain equilibrium conditions rapidly, the toning pad was first saturated with magenta toner by applying toner across its width and pressing it with a 1-inch (2.54 cm) wide spatula. A 1.25-inch (3.18 cm) square self-sticking label was attached to an exposed area of the imaged element. The imaged element was then passed through the automatic toning apparatus at 4 ft/min (1.22 m/min). The label protected the exposed, nontacky area of the element under it from being contacted with toner particles during the toning step. The label was removed after toning the element and L*A*B* data were obtained for the area under the label. This value was subtracted from the value obtained in the unwiped, unprotected, nontacky or background areas of the toned element. Three L*A*B* measurements were made on each toned element. The measurements were made to within 1 inch (2.54 cm) of the trailing edge of the toned element. This is important since the trailing edge of the toned element is most sensitive to poor clean-up, i.e., clean-up degrades from the leading to the trailing edge of the toned element. The measurements were made using an ACS spectrosensor, manufactured by Applied Color Systems, Princeton, N.J. The L*A*B* data are reported as Δ E, calculated as described above, the larger the value of Δ E, the greater the background color. In normal manufacturing, a Δ E of 0.6 is usually considered the maximum acceptable value. Background color was also rated visually using a scale of 1 to 5; 1 being the best, and 5 the worst. Values of 1 to 1+ were acceptable and values of 2 or greater were unacceptable. Results are shown in Table 2.

TABLE 2

| LIQUID ADDI-TIVE(S) | AMOUNT (%) | AGING WEEKS/°C. | BACKGROUND COLOR VISUAL | SPECTRO-SENSOR (ΔE) |
|---|---|---|---|---|
| 1 | 25 | FRESH | 1 | 0.0 |
| 12/11 | 10/4 | FRESH | 1 | 0.0 |
| 13/11 | 7/9 | FRESH | 1 | 0.0 |
| 14 | 20 | FRESH | 1 | 0.0 |
| 1 | 25 | 2/75 | 1 | 0.0 |
| 12/11 | 10/4 | 2/75 | 3 | 6.4 |
| 13/11 | 7/9 | 2/75 | 1 | 0.0 |
| 14 | 20 | 2/75 | 1 | 0.0 |
| 1 | 25 | 4/75 | 1 | 0.0 |
| 13/11 | 7/9 | 4/75 | 2 | — |
| 14 | 20 | 4/75 | 2+ | — |
| 1 | 25 | 1/110 | 1 | 0.0 |
| 14 | 20 | 1/110 | 2+ | 2.6 |
| 1 | 25 | 2/110 | 1 | 0.0 |
| 14 | 20 | 2/110 | 2 | 1.5 |
| 1 | 25 | 4/110 | 1 | 0.0 |
| 14 | 20 | 4/110 | 3 | — |

EXAMPLE 2

The following ingredients were used in the preparation of black toner:

| INGREDIENT | AMOUNT (G) |
|---|---|
| Carbon black, Sterling black NS N774, pigment black 7 (C.I. Constitution No. 77266). Cabot Corp., Boston, MA | 6300.0 |
| Cellulose Acetate | 6300.0 |
| Acetone | 22669.6 |
| Water | 22680.6 |

The water and acetone were thoroughly mixed and were charged to a Type 30-S attritor stirred and jacketed ball mill (Union Process Co., Akron, Ohio). This mill contained ⅛ in. (0.49 cm) Type 440 stainless steel balls that were agitated at 150 rpm. A nitrogen atmosphere was maintained in the mill during the mixing procedure. Approximately two-thirds of the weight of the cellulose acetate was then added during a 3 to 5 minute period and was agitated in the liquid for about 2 minutes. The pigment was then added over a 2-minute period followed by the remainder of the cellulose acetate. The mixture was then agitated at about 150 rpm in the mill for 6 hrs. at 22° C.; 5 gallons of water were added in 2 minutes followed by agitation for 5 minutes. The mill was drained and washed with water and the combined effluents were filtered to collect the wet toner. The wet toner was water washed and dried in an oven at 115° to 125° C., and the dried toner was pulverized in a pin mill. The particle size distribution of the toner at this point was 0.2 to 30 micrometers with not more than 50% of the particles less than 1 micron equivalent spherical diameter.

400 grams of the untreated black toner, an appropriate amount of a surface treatment liquid as indicated in Table 1 and two 9-inch (22.86 cm) stainless steel chains were added to a two-quart Bain Marie container (Le Beau Products, Baraboo, Wis. 53913). The contents were stirred by hand with a spatula so that no "wet" spots were left on the bottom or sides of the container. The mixture was then blended 30 minutes on a Red Devil Paint Conditioner, Model MKI-R (Red Devil, Inc., Union, N.J.). The surface treated black toners were then applied to positive-working and negative-working photosensitive elements by means of an automatic toning apparatus such as that described in Tobias, U.S. Pat. No. 4,069,791. The positive working element used was similar to that described in Example 1 of Assignee's U.S. Pat. No. 3,649,269. The negative-working element used was similar to that described in Example 1 of Assignee's U.S. Pat. No. 4,565,773. To obtain equilibrium conditions rapidly, the toning pad was first saturated with black toner by applying toner across its width and pressing it with a 1-inch (2.54 cm) wide spatula. A 1.25-inch (3.18 cm) square self-sticking label was attached to an exposed area of the imaged element. The imaged element was then passed through the automatic toning apparatus at 4 ft/min (1.22 m/min). The label protected the exposed, nontacky area of the element under it from being contacted with toner particles during the toning step. The label was removed after toning the element and the results given in Table 3 were obtained as previously described.

TABLE 3

| SAMPLE NO. | LIQUID ADDI-TIVE(S) | LEVEL (g/100 g toner) | CLEAN-UP POSITIVE VIS | SS (ΔE) | NEGATIVE VIS | SS (ΔE) |
|---|---|---|---|---|---|---|
| CONTROL 1 | 12/11 | 10.0/4.0 | 2 | — | 3 | — |
| CONTROL 2 | 13/11 | 5.0/7.0 | 2 | — | 1 | — |
| CONTROL 3 | 14 | 15.0 | 1 | — | 1 | — |

TABLE 3-continued

| SAMPLE NO. | LIQUID ADDI- TIVE(S) | LEVEL (g/100 g toner) | CLEAN-UP POSITIVE | | CLEAN-UP NEGATIVE | |
|---|---|---|---|---|---|---|
| | | | VIS | SS (ΔE) | VIS | SS (ΔE) |
| CONTROL 4 | 0 | 0 | 4 | 31.8 | 4 | 34.7 |
| 1 | 1 | 30.0 | 1 | 0.0 | 1 | 0.0 |
| 2 | 4 | 30.0 | 1+ | 0.2 | 2 | 3.2 |
| 3 | 2 | 30.0 | 1 | 0.0 | 1 | 0.1 |
| 4 | 3 | 30.0 | 1+ | 0.3 | 1 | 0.3 |
| 5 | 5 | 30.0 | 1+ | 0.3 | 3 | 3.1 |
| 6 | 6 | 30.0 | 1 | 0.1 | 1 | 0.1 |
| 7 | 7 | 30.0 | 1 | 0.3 | 1 | — |
| 8 | 9 | 30.0 | 1+ | — | 1+ | — |
| 9 | 10 | 30.0 | 1+ | 0.7 | 1 | — |

For fresh (unaged) toners, the results obtained with Fluorad ® and other compounds within the invention are similar to those seen with a siloxane-oxyalkylene block copolymer, Control 3. The advantages of toners surface coated according to the invention are seen particularly on aging.

EXAMPLE 3

A magenta toner was prepared and surface treated as previously described in Example 1 using the liquid treatments and treatment levels outlined in Table 4. The toners were used to tone a negative-working photopolymerizable element similar to that described in Example 2 with the results outlined in Table 4.

TABLE 4

| SAMPLE NO. | LIQUID ADDI- TIVE(S) | LEVEL (g/100 g toner) | AGING TIME/TEMP WEEKS/°C. | CLEAN- UP | |
|---|---|---|---|---|---|
| | | | | VIS | SS (ΔE) |
| CONTROL 1 | 12/11 | 10.0/4.0 | FRESH | 1+ | — |
| CONTROL 2 | 12/11 | 10.0/4.0 | 2/75 | 3 | — |
| CONTROL 3 | 13/11 | 7.0/9.0 | FRESH | 1 | — |
| CONTROL 4 | 13/11 | 7.0/9.0 | 4/75 | 1 | — |
| CONTROL 5 | 14 | 20.0 | FRESH | 1 | — |
| CONTROL 6 | 14 | 20.0 | 2/75 | 1 | 0.0 |
| CONTROL 7 | 14 | 20.0 | 4/75 | 3 | 8.7 |
| CONTROL 8 | 14 | 20.0 | 1/120 | 2+ | 7.2 |
| CONTROL 9 | 14 | 20.0 | 2/120 | 3 | 11.4 |
| 1 | 1 | 25.0 | FRESH | 1 | 0.0 |
| 2 | 1 | 25.0 | 2/75 | 1 | 0.0 |
| 3 | 1 | 25.0 | 4/75 | 1 | 0.0 |
| 4 | 1 | 25.0 | 1/120 | 1 | 0.0 |
| 5 | 1 | 25.0 | 2/120 | 1 | 0.1 |

EXAMPLE 4

The following ingredients were used in the preparation of the cyan toner:

| INGREDIENT | AMOUNT (G) |
|---|---|
| Monastral ® Blue G. BT-383-D. (Copper phthalocyanine, Pigment Blue 15, C.I. 74160) | 1728 |
| Cellulose Acetate | 7871 |
| Acetone | 27,669.6 |
| Water | 22,680.9 |

The toner was prepared and surface treated with Fluorad ® FC-171 as described in Example 1. 20 grams of Fluorad ® FC-171 were used per 100 grams of toner.

The following ingredients were used in the preparation of the yellow toner:

| INGREDIENT | AMOUNT (G) |
|---|---|
| Dalamar ® yellow (Pigment Yellow 74, C.I. 11741), Heubach Inc., Newark, NJ | 4360 |
| Cellulose Acetate | 6538 |
| Acetone | 27669.6 |
| Water | 22680.6 |

The toner was prepared as described in Example 1. The dried toner was then surface treated with 12.5 grams of polydimethylsiloxane fluid/100 grams of toner by the method described in Example 1. Ten (10) grams of Fluorad ® FC-171/100 grams of toner were applied second by the same procedure.

The black toner described in Example 2, the magenta toner described in Example 3, and the cyan and yellow toners described in this example were used to make four-color surprints with both positive- and negative-working photosensitive elements. The procedure for making the four color positive-working surprints was the same as that described in Example 5 of Fickes, U.S. Pat. No. 4,369,240, except the support described in Example 1 of U.S. Pat. No. 4,579,810 was used instead of Kromekote ®. Also, after exposure, the exposed element was taped securely to a suitable flat surface and the clear polyethylene terephthalate cover sheet was stripped by pulling at one corner with an even, continuous motion at an angle of about 135° to 180°. This latter procedure was used for each of the four colored layers. The proof was finished with a final fifth layer of the positive-working photosensitive element. This fifth layer was exposed for 1 minute and then the clear polyethylene terephthalate cover sheet was hand-stripped. The procedure used for making the four color negative-working surprint was the same as that described for positive- except that a negative-working photosensitive element similar to that described in Example 1 of Matrick, U.S. Pat. No. 4,565,773, was used.

We claim:

1. A dry nonelectroscopic toner comprising pigmented organic resin particles having a size distribution within the range of 0.2 to 30 micrometers and not more than 50 percent of the particles being less than 1 micrometer particle size, the improvement wherein the pigmented particles are surface coated with 3 to 40% by weight of an organofunctional substituted fluorocarbon compound having a boiling point under normal atmospheric conditions greater than 300° F., and (1) having a general formula R(f)QA wherein R(f) is a perfluoroalkyl group, $C_nF_{(2n+1)}$, where n is from 4 to 20;

Q is a divalent bridging group capable of connecting the R(f) group with the A group, Q being an alkylene/oxy group, $(-CH_2-)_xO-$, or an alkylene group, $(-CH_2-)_x$, where x is from 2 to 6; a sulfonamido group, $-SO_2N(R_1)-$; or a sulfonamido/alkylene group, $-SO_2N(R_1)(CH_2)_x-$, where $R_1$ is $C_1$ to $C_6$ alkyl and x is from 2 to 6; and A is the terminal group, A being H when Q is sulfonamido; $-(R_2O)_mR_3$ where $R_2$ is an alkylene group of 2 to 6 carbons or mixtures thereof, and $R_3$ is H or $C_1$ to $C_4$ alkyl, and m is 1 to 22; or A is an acrylate group, $-OOCC(R_4)=CH_2$, where $R_4$ is H, $-CH_3$, or $-C_2H_5$; or (2) being a fluoroaliphatic polymeric ester.

2. A dry nonelectroscopic toner of claim 1, wherein the substituted fluorocarbon compound is a liquid having a viscosity less than 5,000 cs within the temperature range 20° to 30° C.

3. A toner of claim 1, wherein the pigmented resin particles are surface coated with about 5 to 30 percent by weight of the organofunctional substituted fluorocarbon compound.

4. A dry nonelectroscopic toner of claim 1, wherein the substituted fluorocarbon compound is of the formula:

$$C_nF_{(2n+1)}SO_2N(R_1)(R_2O)_mR_3,$$

where
n is 4 to 20,
m is 0 to 22,
$R_2$ is alkylene of 2 to 6 carbons or mixtures thereof,
$R_1$ and $R_3$ are independently H or $C_1$ to $C_6$ alkyl, provided that when m is O, $R_3$ is H.

5. A toner of claim 4, wherein n is 6 to 8.

6. A toner of claim 5, wherein n is 6.5 to 7.5, and m is 7.

7. A toner of claim 4, wherein the substituted fluorocarbon compound is a liquid having a viscosity less than 5,000 cs within the temperature range 20° to 30° C.

8. A toner of claim 4, wherein the substituted fluorocarbon compound is present in a range of about 5 to 30% by weight.

9. A toner of claim 5, wherein the substituted fluorocarbon compound is present in a range of about 5 to 30% by weight.

10. A toner of claim 6, wherein the substituted fluorocarbon compound is present in a range of about 5 to 30% by weight.

11. A dry nonelectroscopic toner of claim 1, wherein the substituted fluorocarbon compound is of the formula:

$$C_nF_{(2n+1)}SO_2NR_1R_5,$$

where
n is 4 to 20,
$R_1$ is $C_1$ to $C_6$ alkyl,
$R_5$ is an acrylate, $-OOCC(R_4)=CH_2$, where $R_4$ is H, $CH_3$, or $C_2H_5$.

12. A dry nonelectroscopic toner according to claim 1, wherein the substituted fluorocarbon compound is a fluoroaliphatic polymeric ester.

13. A toner of claim 12, wherein the substituted fluorocarbon compound is present in a range of about 5 to 30% by weight.

14. A toner of claim 13, wherein the substituted fluorocarbon compound is a liquid having a viscosity less than 5,000 cs within the temperature range 20° to 30° C.

15. A dry nonelectroscopic toner of claim 1, wherein the substituted fluorocarbon compound is of the formula:

$$C_nF_{(2n+1)}SO_2N(R_1)(R_2O)_m-R_3,$$

where
n is 6 to 8,
$R_1$ is $C_2H_5$,
$R_2$ is $-CH_2CH_2-$
m is O or 6 to 8,
$R_3$ is H or $CH_3$, and provided that m is O when $R_3$ is H.

16. A dry nonelectroscopic toner of claim 15, wherein n is 6.5 to 7.5 and m is 7.

17. A toner of claim 16, wherein the substituted fluorocarbon compound is present in a range of about 5 to 30% by weight.

18. A dry nonelectroscopic toner of claim 1, wherein the substituted fluorocarbon compound is of the formula:

$$C_nF_{(2n+1)}-R_2O-(R_2O)_m-R_3,$$

where
n is 4 to 20,
m is 5 to 13,
$R_2$ is an alkylene of 2 to 6 carbons, or mixtures thereof,
$R_3$ is H or $C_1$ to $C_4$ alkyl.

19. A dry nonelectroscopic toner of claim 18, wherein $R_2$ is $-CH_2CH_2-$.

20. A dry nonelectroscopic toner of claim 19, wherein n is 6 to 8 and m is 6 to 8.

21. A dry nonelectroscopic toner of claim 20, wherein n is 7.3 and m is 7.3.

22. A dry nonelectroscopic toner of claim 18, wherein the substituted fluorocarbon compound is present in a range of about 5 to 30 percent by weight.

23. A dry nonelectroscopic toner of claim 21, wherein the substituted fluorocarbon compound is present in a range of about 5 to 30 percent by weight.

24. A dry nonelectroscopic toner of claim 1, wherein the substituted fluorocarbon compound is of the formula:

$$C_nF_{(2n+1)}(CH_2)_xR_5,$$

where
n is 4 to 20,
x is 2 to 6,
$R_5$ is $-OOCC(R_4)=CH_2$, where $R_4$ is H, $CH_3$, or $C_2H_5$.

25. In a nonelectroscopic development process, comprising the steps of:
(a) providing a photosensitive element bearing an imagewise tacky and nontacky latent image thereon,
(b) applying to said photosensitive element a dry, nonelectroscopic toner which adheres selectively to the tacky image areas, and
(c) removing the excess toner,
the improvement comprising applying a dry, nonelectroscopic toner according to claim 1.

26. In a nonelectroscopic development process, comprising the steps of:
(a) providing a photosensitive element bearing an imagewise tacky and nontacky latent image thereon,
(b) applying to said photosensitive element a dry, nonelectroscopic toner which adheres selectively to the tacky image areas, and
(c) removing the excess toner,
the improvement comprising applying a dry, nonelectroscopic toner according to claim 8.

27. In a nonelectroscopic development process, comprising the steps of:
(a) providing a photosensitive element bearing an imagewise tacky and nontacky latent image thereon,
(b) applying to said photosensitive element a dry, nonelectroscopic toner which adheres selectively to the tacky image areas, and
(c) removing the excess toner, the improvement comprising applying a dry, nonelectroscopic toner according to claim 9.

28. In a nonelectroscopic development process, comprising the steps of:
(a) providing a photosensitive element bearing an imagewise tacky and nontacky latent image thereon,
(b) applying to said photosensitive element a dry, nonelectroscopic toner which adheres selectively to the tacky image areas, and
(c) removing the excess toner, the improvement comprising applying a dry, nonelectroscopic toner according to claim 10.

29. In a nonelectroscopic development process, comprising the steps of:
(a) providing a photosensitive element bearing an imagewise tacky and nontacky latent image thereon,
(b) applying to said photosensitive element a dry, nonelectroscopic toner which adheres selectively to the tacky image areas, and
(c) removing the excess toner, the improvement comprising applying a dry, nonelectroscopic toner according to claim 13.

30. In a nonelectroscopic development process, comprising the steps of:
(a) providing a photosensitive element bearing an imagewise tacky and nontacky latent image thereon,
(b) applying to said photosensitive element a dry, nonelectroscopic toner which adheres selectively to the tacky image areas, and
(c) removing the excess toner, the improvement comprising applying a dry, nonelectroscopic toner according to claim 15.

31. In a nonelectroscopic development process, comprising the steps of:
(a) providing a photosensitive element bearing an imagewise tacky and nontacky latent image thereon,
(b) applying to said photosensitive element a dry, nonelectroscopic toner which adheres selectively to the tacky image areas, and
(c) removing the excess toner, the improvement comprising applying a dry, nonelectroscopic toner according to claim 22.

32. In a nonelectroscopic development process, comprising the steps of:
(a) providing a photosensitive element bearing an imagewise tacky and nontacky latent image thereon,
(b) applying to said photosensitive element a dry, nonelectroscopic toner which adheres selectively to the tacky image areas, and
(c) removing the excess toner, the improvement comprising applying a dry, nonelectroscopic toner according to claim 23.

33. In a nonelectroscopic development process, comprising the steps of:
(a) providing a photosensitive element bearing an imagewise tacky and nontacky latent image thereon,
(b) applying to said photosensitive element a dry, nonelectroscopic toner which adheres selectively to the tacky image areas, and
(c) removing the excess toner, the improvement comprising applying a dry, nonelectroscopic toner according to claim 24.

* * * * *